United States Patent
Chuang et al.

(10) Patent No.: US 9,496,276 B2
(45) Date of Patent: Nov. 15, 2016

(54) CMP FABRICATION SOLUTION FOR SPLIT GATE MEMORY EMBEDDED IN HK-MG PROCESS

(71) Applicant: TAIWAN SEMICONDUCTOR MANUFACTURING CO., LTD., Hsinchu (TW)

(72) Inventors: Harry Hak-Lay Chuang, Singapore (SG); Wei-Cheng Wu, Zhubei (TW); Chang-Ming Wu, New Taipei (TW); Shih-Chang Liu, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/092,912

(22) Filed: Nov. 27, 2013

(65) Prior Publication Data

US 2015/0145022 A1    May 28, 2015

(51) Int. Cl.
*H01L 29/66* (2006.01)
*H01L 29/792* (2006.01)
*H01L 27/115* (2006.01)

(52) U.S. Cl.
CPC ................................ *H01L 27/11573* (2013.01)

(58) Field of Classification Search
CPC .............. H01L 21/823418; H01L 21/823456; H01L 21/28008; H01L 29/66484; H01L 29/792; H01L 27/22573; H01L 21/02164; H01L 21/0217; H01L 21/28282; H01L 27/11568; H01L 29/66833; H01L 29/4234; H01L 29/42344; H01L 27/11573
USPC ........................... 257/326; 438/633, 264, 733
See application file for complete search history.

(56) References Cited

U.S. PATENT DOCUMENTS

| | | | |
|---|---|---|---|
| 8,163,615 B1* | 4/2012 | White | H01L 21/28273 438/257 |
| 8,901,632 B1* | 12/2014 | Perera | H01L 29/7831 257/314 |
| 2010/0193857 A1* | 8/2010 | Nakagawa | H01L 27/11521 257/324 |
| 2013/0065368 A1* | 3/2013 | Yasui et al. | 438/257 |
| 2013/0267072 A1 | 10/2013 | Hall et al. | |
| 2013/0267074 A1* | 10/2013 | Hall | H01L 21/82 438/299 |
| 2014/0120713 A1* | 5/2014 | Shroff et al. | 438/593 |
| 2014/0227843 A1* | 8/2014 | Tsukamoto et al. | 438/275 |
| 2014/0302646 A1* | 10/2014 | Hirano et al. | 438/197 |
| 2015/0041875 A1* | 2/2015 | Perera | H01L 29/78 257/314 |

OTHER PUBLICATIONS

L. Masoero et al., "Scalability of split-gate charge trap memories down to 20nm for low-power embedded memories," Electron Devices Meeting (IEDM), 2011 IEEE International , vol., No., pp. 9.5.1-9.5.4 (2011).

* cited by examiner

*Primary Examiner* — Caridad Everhart
(74) *Attorney, Agent, or Firm* — McDermott Will & Emery LLP (57) ABSTRACT

A semiconductor device includes a substrate, at least one logic device and a split gate memory device. The at least one logic device is located on the substrate. The split gate memory device is located on the substrate and comprises a memory gate and a select gate. The memory gate and the select gate are adjacent to and electrically isolated with each other. A top of the select gate is higher than a top of the memory gate.

19 Claims, 8 Drawing Sheets

CMP FABRICATION SOLUTION FOR SPLIT GATE MEMORY EMBEDDED IN HK-MG PROCESS

BACKGROUND

Description of Related Art

As the increasingly scaling-down of integrated circuit devices, a high-k metal gate (HK-MG) technology has become a critical technology for generations next to a 45 nm generation because of HK-MG devices have superior performance over conventional polysilicon-based devices. In a HK-MG device, an integrated circuit device is fabricated with a metal material for the gate electrode and a high-k dielectric for the gate dielectric.

However, for integrating split gate memory into a HK-MG process, polishing dishing is induced in the split gate memory region. The polishing dishing in the split gate memory region results in metal residue in the memory region, thereby causing a memory array short issue.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION

The making and using of the present embodiments are discussed in detail below. It should be appreciated, however, that the present disclosure provides many applicable concepts that can be embodied in a wide variety of specific contexts. The specific embodiments discussed are merely illustrative of specific ways to make and use the disclosed subject matter, and do not limit the scope of the different embodiments. The present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

In a traditional split gate memory, a memory gate is higher than a select gate due to an isolation concern for good retention performance. Therefore, when the split gate memory is integrated into a HK-MG process, the select gate is lower than a logic device, an SRAM device, an IO device or a HV device on a logic region. During a metal gate replacement process, a polishing operation is performed on an interlayer dielectric layer covering the split gate memory and the devices on the logic region for planarization. However, dishing is induced in the interlayer dielectric layer above the split gate memory due to the select gate which is lower than the devices on the logic region. Thus, in a metal layer polishing operation after the metal layer depositing on the interlayer dielectric layer following the polishing of the interlayer dielectric layer, a portion of the metal layer remains in the interlayer dielectric layer above the split gate memory, thereby resulting in memory array short.

Embodiments of the present disclosure are directed to providing a split gate memory structure for CMP fabrication solution to enable the split gate memory to be embedded in an HK-MG process without dishing above the split gate memory. The split gate memory structure includes a select gate and a memory gate higher than the select gate. In some embodiments, the select gate and the devices in the logic region are substantially at the same elevation.

Figure 1:
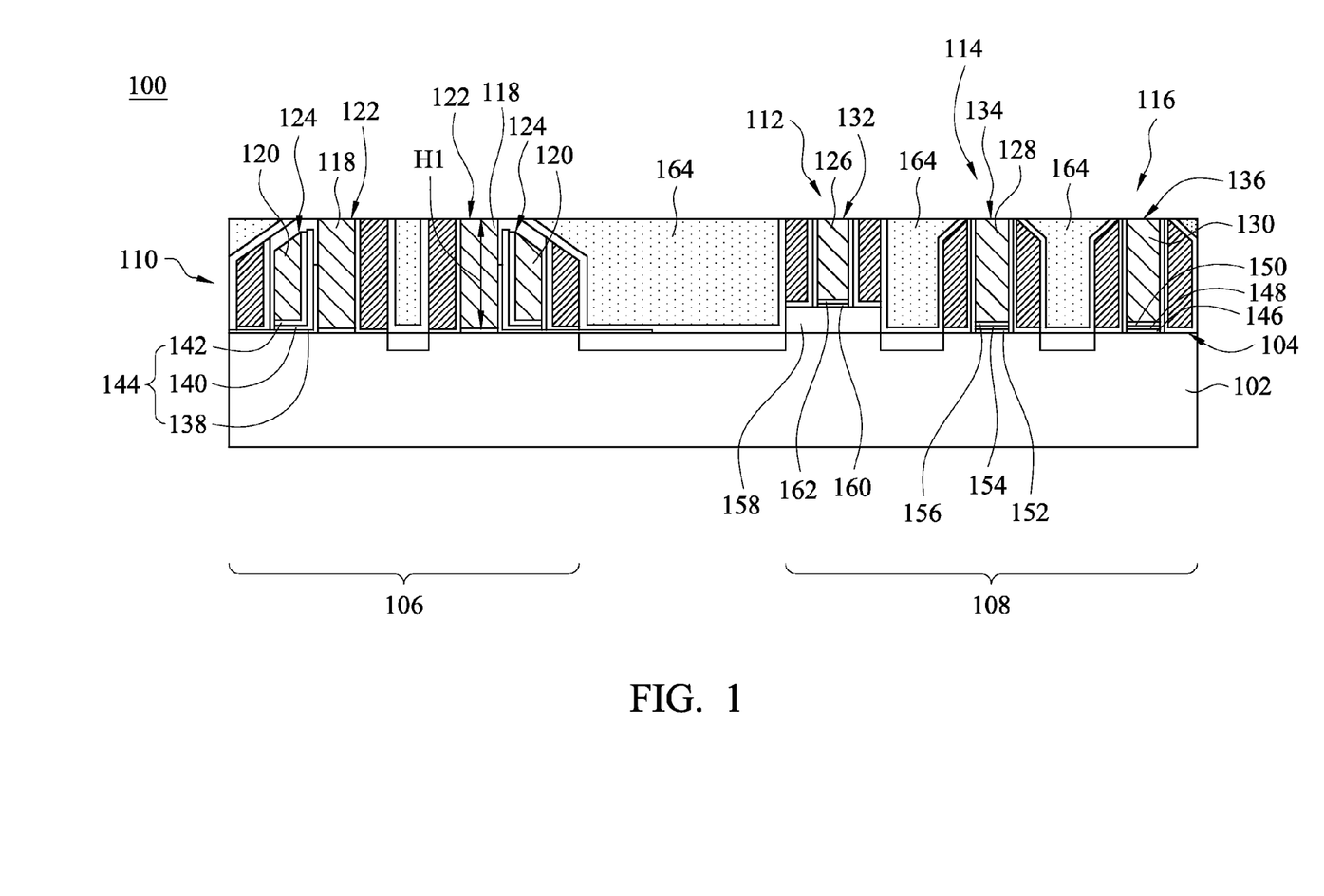
FIG. 1 is schematic cross-sectional view of a semiconductor device in accordance with various embodiments.

FIG. 1 is schematic cross-sectional view of a semiconductor device in accordance with various embodiments. As shown in FIG. 1, a semiconductor device 100 includes a substrate 102, a split gate memory device 110 and at least one logic device, such as at least one MOS device. The semiconductor device 100 includes a memory region 106 and a logic region 108. The split gate memory device 110 is disposed in the memory region 106, and the at least one logic device is disposed in the logic region 108. In some embodiments, the at least one logic device includes at least one high voltage (HV) device, at least one SRAM device, at least one IO device or at least one core device. In the embodiments as shown in FIG. 1, the at least one logic device includes a HV device 112 and two MOS devices 114 and 116.

The substrate 102 is a semiconductor substrate. The substrate 102 is formed of a single-crystalline semiconductor material or a compound semiconductor material. In addition, the substrate 102 is a bulk substrate or a semiconductor-on-insulator (SOI) substrate. In some embodiments, the substrate 102 is a silicon substrate. In another embodiments, carbon, germanium, gallium, arsenic, nitrogen, indium, phosphorus, and/or the like, is also used as a material of the substrate 102.

The split gate memory device 110 is disposed in the memory region 106 and on a surface 104 of the substrate 102. The split gate memory device 110 includes a memory gate 120 and a select gate 122. The memory gate 120 is located on an outer side of the select gate 118 and adjacent to the select gate 118. The memory gate 120 is electrically isolated from the select gate 118. In the present disclosure, the select gate 118 is elevated higher than the memory gate 120, i.e. a top 122 of the select gate 118 is higher than a top 124 of the memory gate 120. In some embodiments, an elevation difference between the top 122 of the select gate 118 and the top 124 of the memory gate 120 is greater than ten percent of a height H1 of the select gate 118. In another embodiments, the select gate 118 and the memory gate 120 are formed from polysilicon.

In some embodiments, the split gate memory device 110 includes an intermediate structure 144 between the memory gate 120 and the select gate 118. In some exemplary embodiments, the intermediate structure 144 includes a bottom layer 138, a trap layer 140 and a top layer 142 stacked in sequence. In another exemplary embodiments, the intermediate structure 144 includes an oxide/nitride/oxide stacked structure including an oxide bottom layer, a nitride trap layer and an oxide top layer.

The at least one logic device, such as the HV device 112 and the MOS devices 114 and 116, are disposed in the logic region 108 and on the surface 104 of the substrate 102. In some embodiments, the top 122 of the select gate 118 and a top of the at least one logic device, such as a top 132 of the HV device 112, a top 134 of the MOS device 114 or a top 136 of the MOS device 116, are substantially at the same elevation. In another embodiments, the top 132 of the HV device 112, the top 134 of the MOS device 114 and the top 136 of the MOS device 116 are substantially at the same elevation. In addition, the at least one logic device has a high-k metal gate structure. For example, the HV device 112 includes a metal gate 126, a capping layer 162, a high-k dielectric layer 160 and an oxide layer 158; the MOS device 114 includes a metal gate 128, a capping layer 156, a high-k dielectric layer 154 and an interface layer 152; and the MOS device 112 includes a metal gate 130, a capping layer 150, a high-k dielectric layer 148 and an interface layer 146. In some embodiments, the metal gates 126, 128 and 130 are formed from the same material. In another embodiments, the metal gates 126, 128 and 130 are formed from different materials.

The semiconductor device 100 includes a dielectric layer 164. The dielectric layer 164 is an interlayer dielectric (ILD) layer. The dielectric layer 164 is located on the surface 104 of the substrate 102 and between any two adjacent devices, such as the split gate memory device 110 and the HV device 112, the HV device 112 and the MOS device 114, and the MOS devices 114 and 116. In some embodiments, the dielectric layer 164 is formed from oxide.

Figure 2A:
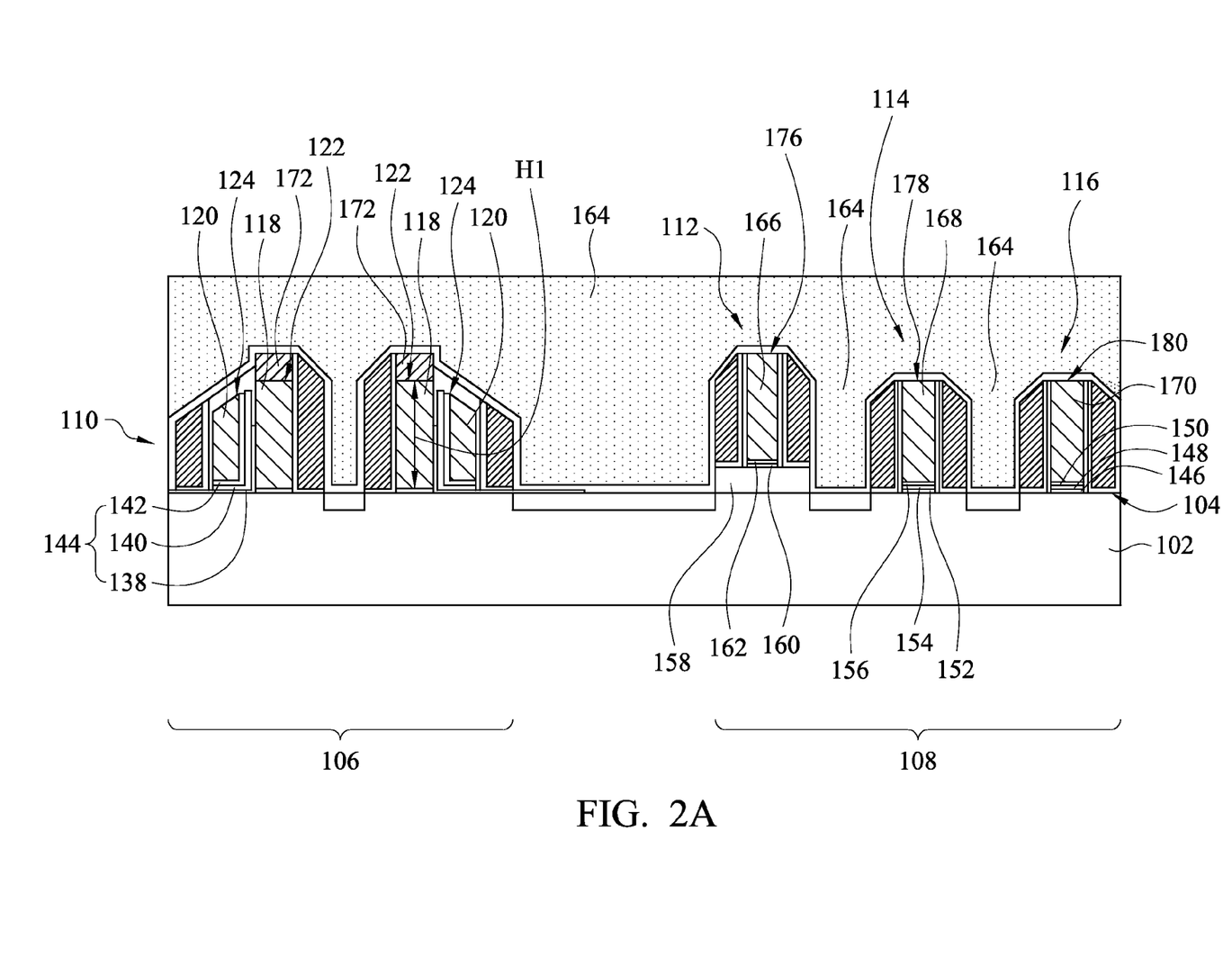
FIG. 2A through FIG. 2E are schematic cross-sectional views of intermediate stages showing a method for manufacturing a semiconductor device in accordance with various embodiments.

Referring to FIG. 2A through FIG. 2E, FIG. 2A through FIG. 2E are schematic cross-sectional views of intermediate stages showing a method for manufacturing a semiconductor device in accordance with various embodiments. As shown in FIG. 2A, a substrate 102 is provided. The substrate 102 is a semiconductor substrate. The substrate 102 is composed of a single-crystalline semiconductor material or a compound semiconductor material. In addition, the substrate 102 is a bulk substrate or a semiconductor-on-insulator substrate. In some embodiments, the substrate 102 is a silicon substrate. In another embodiments, carbon, germanium, gallium, arsenic, nitrogen, indium, phosphorus, and/or the like, is also used as a material of the substrate 102.

At least one logic device, such as a HV device 112 and MOS devices 114 and 116, is formed on a surface 104 of the substrate 102. The HV device 112 and the MOS devices 114 and 116 are formed to respectively include dummy gates 166, 168 and 170. In some embodiments, a top 176 of the dummy gate 166, a top 178 of the dummy gate 168 and a top 180 of the dummy gate 170 are substantially at the same elevation. In another embodiments, the top 176 of the dummy gate 166 is higher than the top 178 of the dummy gate 168 and the top 180 of the dummy gate 170. The dummy gates 166, 168 and 170 may be formed form the same material or different materials. In some exemplary embodiments, the dummy gates 166, 168 and 170 are formed form polysilicon.

In addition, the formation of the at least one logic device includes a high-k dielectric layer. For example, the HV device 112 further includes a capping layer 162, a high-k dielectric layer 160 and an oxide layer 158; the MOS device 114 further includes a capping layer 156, a high-k dielectric layer 154 and an interface layer 152; and the MOS device 112 further includes a capping layer 150, a high-k dielectric layer 148 and an interface layer 146. In some embodiments, the high-k dielectric layers 160, 154 and 148 are formed from the same material. In another embodiments, the high-k dielectric layers 160, 154 and 148 are formed from different materials.

A split gate memory device 110 including a memory gate 120 and a select gate 122 is formed on the surface 104 of the substrate 102. The memory gate 120 is formed adjacent to an outer side of the select gate 118. The memory gate 120 and the select gate 118 are electrically isolated from each other. Typically, the select gate 118 has a flat surface, and the memory gate 120 has an inclined surface because the select gate 118 is fabricated by a photo process and the memory gate 120 is fabricated by a spacer process. In some embodiments, the select gate 118 and the memory gate 120 are formed from polysilicon.

A top 122 of the select gate 118 is higher than a top 124 of the memory gate 120. In some embodiments, an elevation difference between the top 122 of the select gate 118 and the top 124 of the memory gate 120 is greater than ten percent of a height H1 of the select gate 118. The top 122 of the select gate 118 is at a similar or substantially the same elevation with the tops 176, 178 and 180. In some embodiments, the top 176 of the dummy gate 166, the top 178 of the dummy gate 168 and the top 180 of the dummy gate 170 are substantially at the same elevation, and the top 122 of the select gate 118 is substantially at the same elevation with the tops 176, 178 and 180. In other embodiments, the top 176 of the dummy gate 166 is higher than the top 178 of the dummy gate 168 and the top 180 of the dummy gate 170, and the top 122 of the select gate 118 is substantially at the same elevation with one of the tops 176, 178 and 180.

In some embodiments, the formation of the split gate memory device 110 includes an intermediate structure 144 between the memory gate 120 and the select gate 118. In some exemplary embodiments, the intermediate structure 144 includes a bottom layer 138, a trap layer 140 and a top layer 142 stacked in sequence. In other exemplary embodiments, the intermediate structure 144 includes an oxide/nitride/oxide stacked structure including an oxide bottom layer, a nitride trap layer and an oxide top layer. In addition, the formation of the split gate memory device 110 includes a hard mask 172. The hard mask 172 is formed on a top 122 of the select gate 118 to prevent metal silicide, such as nickel silicide (NiSi), from being formed on the select gate 118 in the subsequent operations. In some embodiments, the hard mask 172 is formed from silicon nitride.

In addition, a contact etch stop layer (CESL) 176 is optionally formed to cover the split gate memory device 110, the HV device 112 and the MOS devices 114 and 116. A dielectric layer 164 is then formed to cover the surface 104 of the substrate 102, the split gate memory device, the HV device 112 and the MOS devices 114 and 116, and to be between any two adjacent devices, such as the split gate memory device 110 and the HV device 112, the HV device 112 and the MOS device 114, and the MOS devices 114 and 116, as shown in FIG. 2A. The dielectric layer 164 is an interlayer dielectric layer. A material of the dielectric layer 164 is different from a material of the contact etch stop layer 176. In some embodiments, the dielectric layer 164 is formed from oxide.

Figure 2B:
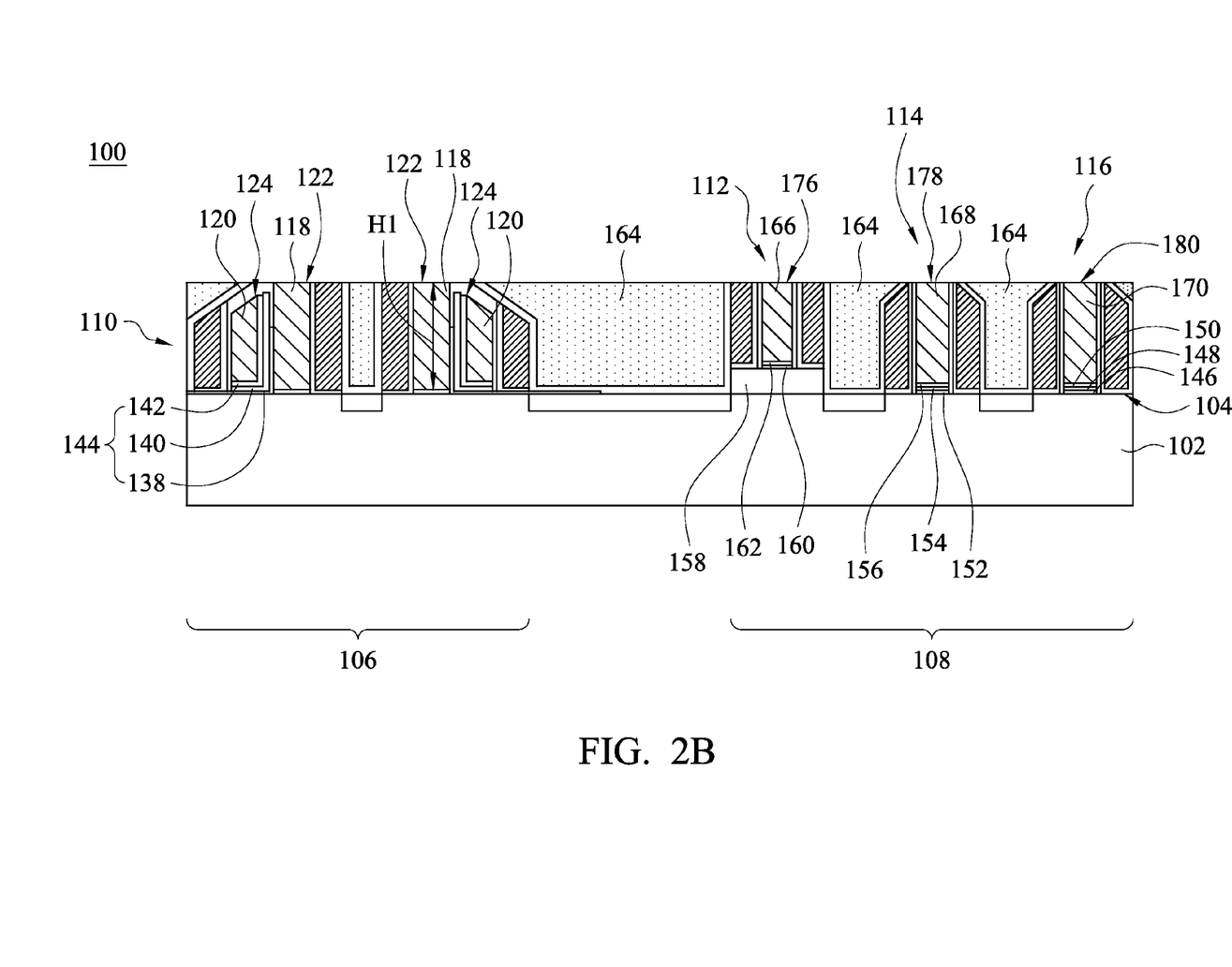

The dielectric layer 164 is polished to expose the top 122 of the select gate 118, a top 176 of the dummy gate 166, a top 178 of the dummy gate 168 and a top 180 of the dummy gate 170, as shown in FIG. 2B. In some embodiments, the dielectric layer 164 is polished using a CMP process. In addition, the polishing stops on the top 122 of the select gate 118, which is formed from polysilicon. In the operation of polishing the dielectric layer 164 includes polishing the hard mask 172. During the polishing operation, because the top 122 of the select gate 118 is higher than the memory gate 120, the top 122 of the select gate 118 is at a similar or substantially the same elevation with the tops 176, 178 and 180, no polishing dishing is induced in the dielectric layer 164 above the split gate memory device 110.

Figure 2C:
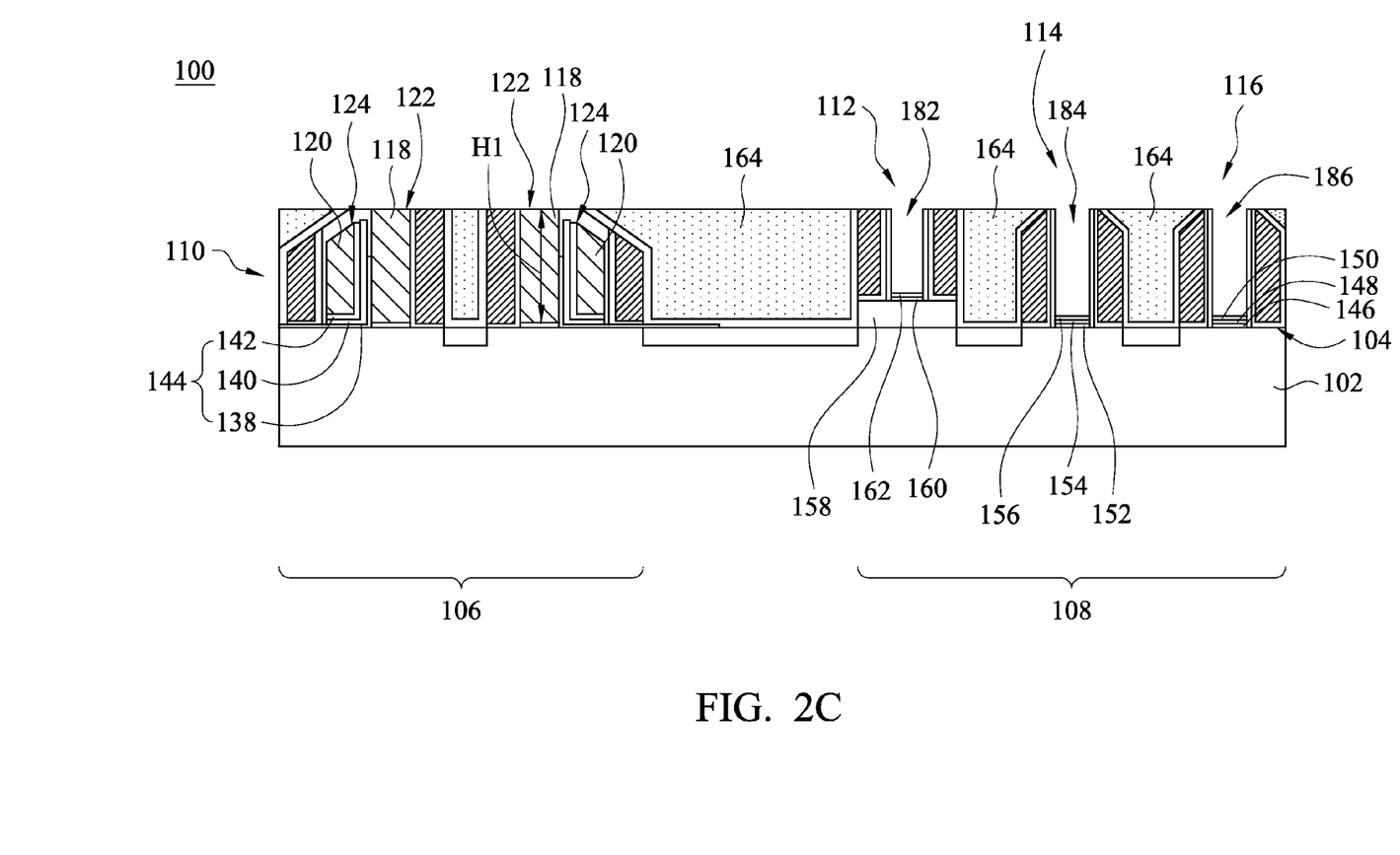
Figure 2D:
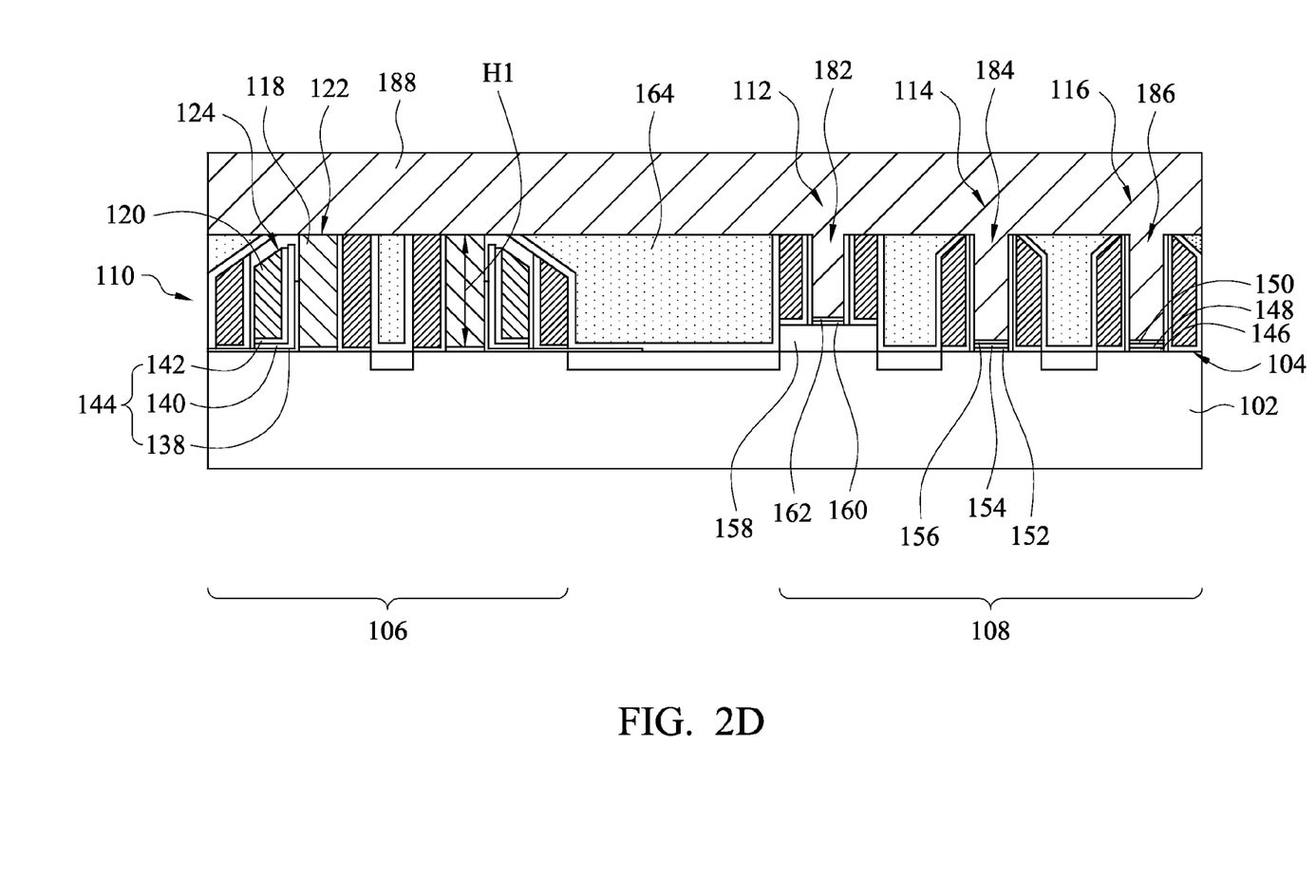

The dummy gates 166, 168 and 170 are removed to form respective recesses 182, 184 and 186 in the HV device 112 and the MOS devices 114 and 116, as shown in FIG. 2C. The dummy gates 166, 168 and the 170 can be removed using any suitable etching processes. A metal layer 188 is formed to fill the recesses 182, 184 and 186, and to cover the dielectric layer 164, the split gate memory device 110, the HV device 112 and the MOS devices 114 and 116, as shown in FIG. 2D. The metal layer 188 can be formed using any suitable metal materials and processes.

Figure 2E:
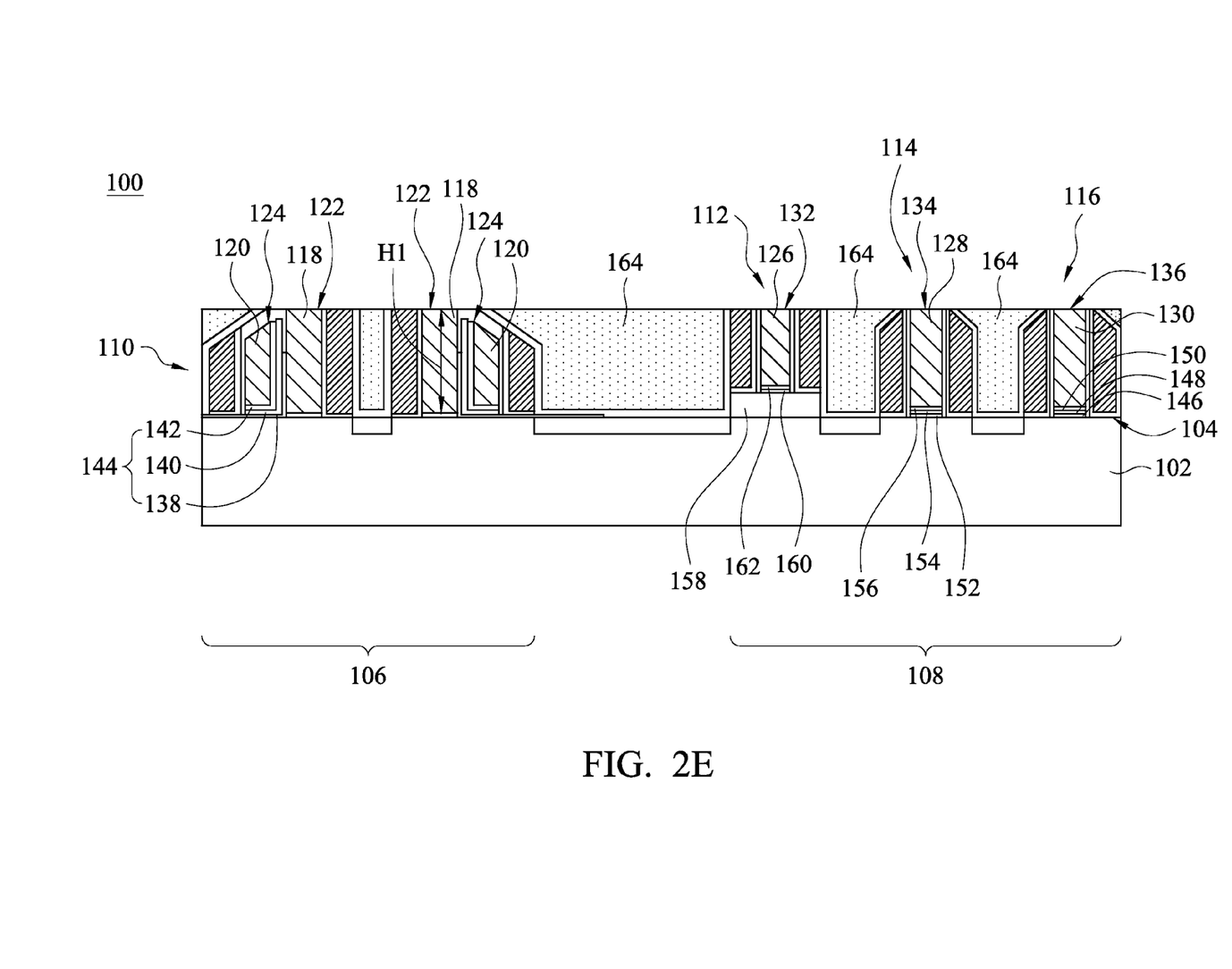

The metal layer 188 is polished to expose the top 122 of the select gate 118. Thus, metal gates 126, 128 and 130 are respectively formed in the recesses 182, 184 and 186 to replace the dummy gates 166, 168 and 170, as shown in FIG. 2E. In some embodiments, the metal layer 188 is polished using a CMP process. After the operation of replacing the dummy gates 166, 168 and 170 with the metal gates 126, 128 and 130 respectively, each of the HV device 112 and the MOS devices 114 and 116 includes a high-k metal gate structure. For example, the HV device 112 includes the metal gate 126 located on the high-k dielectric layer 160; the MOS device 114 includes the metal gate 128 located on the high-k dielectric layer 156; and the MOS device 112 includes the metal gate 130 located on the high-k dielectric layer 148. In addition, the top 122 of the select gate 118, a top 132 of the HV device 112, a top 134 of the MOS device 114 and a top 136 of the MOS device 116, are substantially at the same elevation.

Because no polishing dishing is induced in the dielectric layer 164 above the split gate memory device 110, there is no metal residue on the dielectric layer 164 in the memory region 106 after the operation of respectively using the metal gates 126, 128 and 130 to replace the dummy gates 166, 168 and 170. Accordingly, it can prevent memory array short from occurring.

Figure 3:
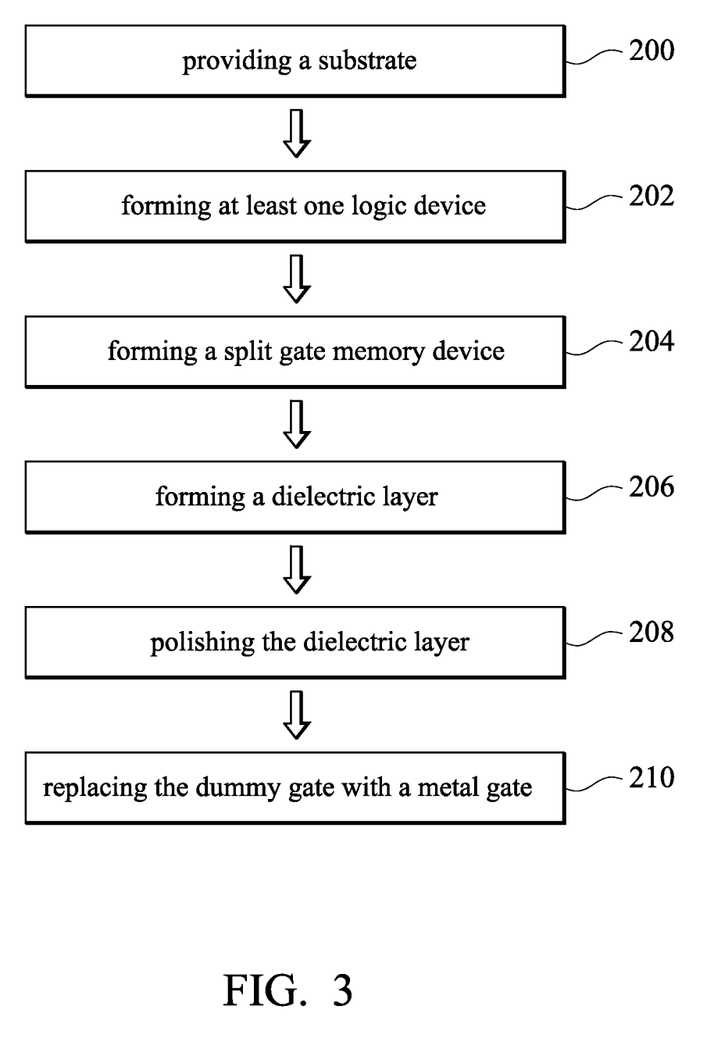
FIG. 3 is a flow chart of a method for manufacturing a semiconductor device in accordance with various embodiments.

Referring to FIG. 3 with FIG. 2A, FIG. 2B and FIG. 2E, FIG. 3 is a flow chart of a method for manufacturing a semiconductor device in accordance with various embodiments. The method begins at operation 200, where a substrate 102 is provided. At operation 202, at least one logic device, such as a HV device 112 and MOS devices 114 and 116, is formed on a surface 104 of the substrate 102. The HV device 112 and the MOS devices 114 and 116 include dummy gates 166, 168 and 170 respectively. At operation 204, a split gate memory device 110 is formed on the surface 104 of the substrate 102. The split gate memory device 110 includes a memory gate 120 and a select gate 122. The memory gate 120 is located on an outer side of the select gate 118 and adjacent to the select gate 118. The select gate 118 has a flat surface, and the memory gate 120 has an inclined surface. A top 122 of the select gate 118 is higher than a top 124 of the memory gate 120. In some embodiments, the top 122 of the select gate 118 is at a similar elevation or substantially at the same elevation with a top 176 of the dummy gate 166, a top 178 of the dummy gate 168 and a top 180 of the dummy gate 170. In addition, the select gate 118 and the memory gate 120 are formed from polysilicon. At operation 206, a dielectric layer 164 is formed to cover the surface 104 of the substrate 102, the split gate memory device, the HV device 112 and the MOS devices 114 and 116, as shown in FIG. 2A. The dielectric layer 164 can be formed using any suitable processes and dielectric materials, such as silicon oxide. At operation 208, the dielectric layer 164 is polished to expose the top 122 of the select gate 118, a top 176 of the dummy gate 166, a top 178 of the dummy gate 168 and a top 180 of the dummy gate 170, as shown in FIG. 2B. In some embodiments, the dielectric layer 164 is polished using a CMP process. At operation 210, the dummy gates 166, 168 and 170 are replaced by metal gates 126, 128 and 130 to complete the HV device 112 and the MOS devices 114 and 116, each of which includes a HK-MG structure.

Figure 4:
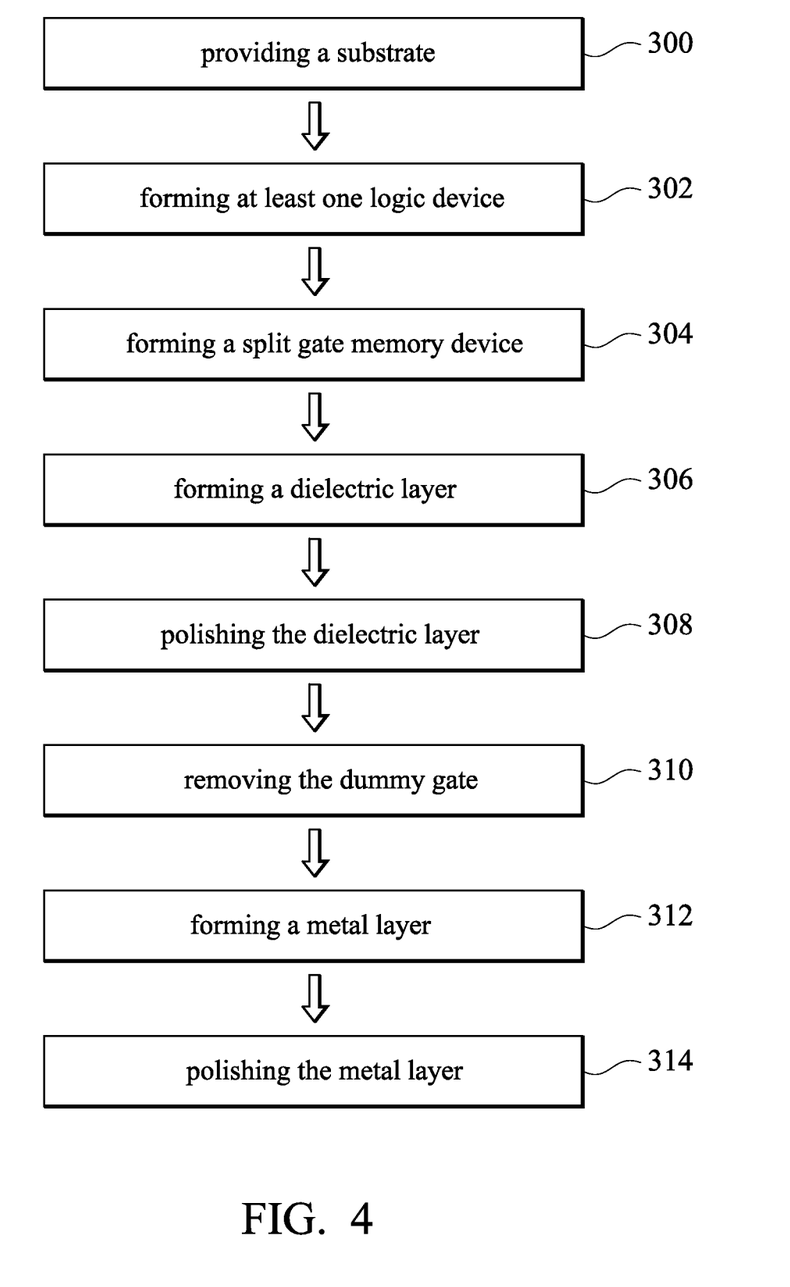
FIG. 4 is a flow chart of a method for manufacturing a semiconductor device in accordance with some embodiments.

Referring to FIG. 4 with FIG. 2A through FIG. 2E, FIG. 4 is a flow chart of a method for manufacturing a semiconductor device in accordance with some embodiments. The method begins at operation 300, where a substrate 102 is provided. At operation 302, at least one logic device, such as a HV device 112 and MOS devices 114 and 116, is formed on a surface 104 of the substrate 102. The HV device 112 and the MOS devices 114 and 116 include dummy gates 166, 168 and 170 respectively. At operation 304, a split gate memory device 110 is formed on the surface 104 of the substrate 102. The split gate memory device 110 includes a memory gate 120 and a select gate 122. The memory gate 120 is located on an outer side of the select gate 118 and adjacent to the select gate 118. The select gate 118 has a flat surface, and the memory gate 120 has an inclined surface. A top 122 of the select gate 118 is higher than a top 124 of the memory gate 120. In some embodiments, the top 122 of the select gate 118 is at a similar elevation or substantially at the same elevation with a top 176 of the dummy gate 166, a top 178 of the dummy gate 168 and a top 180 of the dummy gate 170. In addition, the select gate 118 and the memory gate 120 are formed from polysilicon. At operation 306, a dielectric layer 164 is formed to cover the surface 104 of the substrate 102, the split gate memory device, the HV device 112 and the MOS devices 114 and 116, as shown in FIG. 2A. The dielectric layer 164 can be formed using any suitable processes and dielectric materials, such as silicon oxide. At operation 308, the dielectric layer 164 is polished to expose the top 122 of the select gate 118, the top 176 of the dummy gate 166, a top 178 of the dummy gate 168 and a top 180 of the dummy gate 170, as shown in FIG. 2B. In some embodiments, the dielectric layer 164 is polished using a CMP process. At operation 310, the dummy gates 166, 168 and 170 are removed to respectively form recesses 182, 184 and 186 in the HV device 112 and the MOS devices 114 and 116, as shown in FIG. 2C. The dummy gates 166, 168 and 170 can be removed using any suitable etching processes. At operation 312, a metal layer 188 is formed to fill the recesses 182, 184 and 186, and to cover the dielectric layer 164, the split gate memory device 110, the HV device 112 and the MOS devices 114 and 116, as shown in FIG. 2D. At operation 314, the metal layer 188 is polished to expose the top 122 of the select gate 118 to form metal gates 126, 128 and 130 to respectively replace the dummy gates 166, 168 and 170, as shown in FIG. 2E.

In accordance with an embodiment, the present disclosure discloses a semiconductor device including a substrate, at least one logic device and a split gate memory device. The at least one logic device is located on the substrate. The split gate memory device is located on the substrate and comprises a memory gate and a select gate. The memory gate and the select gate are adjacent to and electrically isolated with each other. A top of the select gate is higher than a top of the memory gate.

In accordance with another embodiment, the present disclosure discloses a method for manufacturing a semiconductor device. In this method, a substrate is provided. At least one logic device including a dummy gate is formed on the substrate. A split gate memory device including a memory gate and a select gate is formed on the substrate. The memory gate and the select gate are adjacent to and electrically isolated with each other, and a top of the select gate and a top of the dummy gate are substantially at the same elevation. A dielectric layer is formed to cover the at least one logic device and the split gate memory device. The dielectric layer is polished to expose the top of the select gate and the top of the dummy gate. The dummy gate is replaced by a metal gate.

In accordance with yet another embodiment, the present disclosure discloses a method for manufacturing a semiconductor device. In this method, a substrate is provided. At least one logic device including a dummy gate is formed on the substrate. A split gate memory device on the substrate including a memory gate and a select gate is formed on the substrate. The memory gate and the select gate are adjacent to and electrically isolated with each other, and a top of the select gate is higher than a top of the memory gate. A dielectric layer is formed to cover the at least one logic device and the split gate memory device. The dielectric layer is polished to expose the top of the select gate and a top of the dummy gate. The dummy gate is removed to form a recess in the at least one logic device. A metal layer is formed to fill the recess and cover the dielectric layer, the split gate memory device and the at least one logic device. The metal layer is polished to expose the top of the select gate.

Although the present embodiments and their advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
   a substrate;
   at least one logic device on the substrate, wherein the at least one logic device has a high-k metal gate structure;
   a split gate memory device on the substrate, the split gate memory device comprising a memory gate and a select gate adjacent to and electrically isolated with each other, wherein the select gate has a flat top surface, and the memory gate has an inclined top surface; and
   a dielectric layer on the substrate and between the at least one logic device and the split gate memory device, wherein a top surface of the dielectric layer and the flat top surface of the select gate are coplanar, and the elevation of the select gate is higher than the elevation of the memory gate.

2. The semiconductor device of claim 1, wherein a top of the select gate and a top of the at least one logic device are substantially at the same elevation.

3. The semiconductor device of claim 1, wherein an elevation difference between a top of the select gate and a top of the memory gate is greater than ten percent of a height of the select gate.

4. The semiconductor device of claim 1, wherein the select gate is formed from polysilicon.

5. The semiconductor device of claim 1, wherein the split gate memory device further comprises an intermediate structure between the memory gate and the select gate.

6. The semiconductor device of claim 5, wherein the intermediate structure comprises a bottom layer, a trap layer and a top layer stacked in sequence.

7. The semiconductor device of claim 5, wherein the intermediate structure comprises an oxide/nitride/oxide stacked structure.

8. A method for manufacturing a semiconductor device, comprising:
   providing a substrate;
   forming at least one logic device on the substrate, wherein the at least one logic device comprises a dummy gate;
   forming a split gate memory device on the substrate, wherein the split gate memory device comprises a memory gate and a select gate adjacent to and electrically isolated with each other, the select gate has a flat top surface, and the memory gate has an inclined top surface, and a top of the select gate and a top of the dummy gate are substantially at the same elevation;
   forming a dielectric layer to cover the at least one logic device and the split gate memory device;
   polishing the dielectric layer to expose the top of the select gate and the top of the dummy gate, wherein after the operation of polishing the dielectric layer is completed, a top surface of the dielectric layer and the flat top surface of the select gate are coplanar, and the elevation of the select gate is higher than the elevation of the memory gate; and
   replacing the dummy gate with a metal gate.

9. The method of claim 8, wherein the operation of forming the split gate memory device comprises forming an elevation difference between the top of the select gate and a top of the memory gate, wherein the elevation difference is greater than ten percent of a height of the select gate.

10. The method of claim 8, wherein the operation of replacing the dummy gate with the metal gate forms the at least one logic device having a high-k metal gate structure.

11. The method of claim 8, wherein the operation of polishing the dielectric layer comprises polishing the dielectric layer using a chemical mechanical polishing process.

12. The method of claim 8, wherein the operation of forming the split gate memory device comprises forming an intermediate structure between the memory gate and the select gate, wherein the intermediate structure comprises a bottom layer, a trap layer and a top layer stacked in sequence.

13. The method of claim 8, wherein the operation of forming the split gate memory device comprises forming the select gate from polysilicon.

14. The method of claim 13, wherein the operation of forming the at least one logic device comprises forming the dummy gate from polysilicon.

15. The method of claim 8, wherein the operation of forming the split gate memory device further comprises forming a hard mask on the select gate.

16. The method of claim 15, wherein the operation of polishing the dielectric layer comprises polishing the hard mask.

17. A method for manufacturing a semiconductor device, comprising:
   providing a substrate;
   forming at least one logic device on the substrate, wherein the at least one logic device comprises a dummy gate;

forming a split gate memory device on the substrate, wherein the split gate memory device comprises a memory gate and a select gate adjacent to and electrically isolated with each other, the select gate has a flat top surface, and the memory gate has an inclined top surface;

forming a dielectric layer to cover the at least one logic device and the split gate memory device;

polishing the dielectric layer to expose a top of the select gate and a top of the dummy gate, wherein after the dielectric layer is polished, the top of the select gate is higher than a top of the memory gate, and an elevation difference between the top of the select gate and the top of the memory gate is greater than ten percent of a height of the select gate;

removing the dummy gate to form a recess in the at least one logic device;

forming a metal layer filling the recess and covering the dielectric layer, the split gate memory device and the at least one logic device; and polishing the metal layer to expose the top of the select gate.

18. The method of claim 17, wherein the operation of polishing the metal layer comprises polishing the metal layer using a chemical mechanical polishing process.

19. The method of claim 17, wherein after the operation of polishing the dielectric layer is completed, a top surface of the dielectric layer and the flat top surface of the select gate are coplanar, and the elevation of the select gate is higher than the elevation of the memory gate.

* * * * *